United States Patent
Wang et al.

(10) Patent No.: US 11,537,766 B2
(45) Date of Patent: Dec. 27, 2022

(54) COLLISION CHECK DATA PROCESSING METHOD AND APPARATUS, ELECTRONIC DEVICE, AND STORAGE MEDIUM

(71) Applicant: China Construction Steel Structure Corp. Ltd., Guangdong (CN)

(72) Inventors: Dongming Wang, Guangdong (CN); Lin Fan, Guangdong (CN); Kuigang Guo, Guangdong (CN); Xiaoxia Yan, Guangdong (CN); Jian Xiong, Guangdong (CN); Jiazhi Li, Guangdong (CN)

(73) Assignee: China Construction Steel Structure Corp. Ltd., Guangdong (CN)

( * ) Notice: Subject to any disclaimer, the term of this patent is extended or adjusted under 35 U.S.C. 154(b) by 467 days.

(21) Appl. No.: 16/620,543

(22) PCT Filed: Jun. 22, 2018

(86) PCT No.: PCT/CN2018/092323
§ 371 (c)(1),
(2) Date: Dec. 9, 2019

(87) PCT Pub. No.: WO2019/029281
PCT Pub. Date: Feb. 14, 2019

(65) Prior Publication Data
US 2020/0125776 A1    Apr. 23, 2020

(30) Foreign Application Priority Data
Aug. 9, 2017   (CN) .......................... 201710675565.3

(51) Int. Cl.
*G06F 30/17*    (2020.01)
*G06F 16/9035*  (2019.01)
(Continued)

(52) U.S. Cl.
CPC ............... *G06F 30/17* (2020.01); *G06F 8/36* (2013.01); *G06F 16/9017* (2019.01); *G06F 16/9035* (2019.01)

(58) Field of Classification Search
CPC ............................. G06F 30/17; G06F 16/9035
See application file for complete search history.

(56) References Cited

U.S. PATENT DOCUMENTS

2007/0038376 A1* 2/2007 Beck ....................... G06F 30/00
                                                                702/6
2013/0336554 A1* 12/2013 Lewis ..................... G06V 20/52
                                                                382/128

FOREIGN PATENT DOCUMENTS

CN    101025768 A    8/2007
CN    103473392 A    12/2013
(Continued)

OTHER PUBLICATIONS

ISA/CN, International Search Report for PCT Patent Application No. PCT/US2018/092323, dated Sep. 10, 2018, 2 pages.

*Primary Examiner* — Van H Oberly
(74) *Attorney, Agent, or Firm* — NK Patent Law (57) ABSTRACT

Disclosed are a collision check data processing method and apparatus, an electronic device, and a storage medium. The method comprises: acquiring generated collision check data, and acquiring an ID number of a collision part according to the collision check data; then acquiring ID numbers corresponding to selected designated parts from a preset database; and determining a target part under collision according to the ID numbers corresponding to the designated parts and the ID number of the collision part. According to the disclosure, a target part under collision can be determined among large amounts of collision check data according to an ID number corresponding to a designated part and an ID number of a collision part. That is, according to the disclosure, a single
(Continued)

item among the collision check data can be checked according to a user requirement, thereby improving the check efficiency effectively.

14 Claims, 5 Drawing Sheets

(51) Int. Cl.
*G06F 16/901* (2019.01)
*G06F 8/36* (2018.01)

(56) References Cited

FOREIGN PATENT DOCUMENTS

| CN | 106503301 A | 3/2017 |
|----|-------------|--------|
| CN | 107609217 A | 1/2018 |

\* cited by examiner

Fig.1

AA acquiring generated collision check data, and acquiring an ID number of a collision part according to the collision check data BB acquiring ID numbers corresponding to selected designated parts from a preset database CC determining a target part under collision according to the ID numbers corresponding to the designated parts and the ID number of the collision part

Fig.2

AAA determining a collision part under collision based on the collision check data, the collision comprising collision between the steel members, collision between the steel member and the bolt, and collision between the bolts AAB acquiring the ID number of the collision part

Fig.3

```
untitled-notepad
File(F) Edit(E) Format(O)  View(V)
Clash -> Id: 358 <-> Id: 8790
Clash -> Id: 358 <-> Id: 8807
Clash -> Id: 358 <-> Id: 8824
Clash -> Id: 8922 <-> Id: 2311
Clash -> Id: 8850 <-> Id: 8322
Clash -> Id: 8456 <-> Id: 7373
Clash -> Id: 8435 <-> Id: 8411
Clash -> Id: 8389 <-> Id: 7297
Clash -> Id: 8368 <-> Id: 8344
Clash -> Id: 4226 <-> Id: 402
Clash -> Id: 3908 <-> Id: 3854
......
```

Fig.4

CCA  looking up the ID number of the collision part in
     the ID numbers corresponding to the designated parts CCB  determining the collision part as the target part under
     collision if the ID number of the collision part is in the
     ID numbers corresponding to the designated parts

Fig.5

| A    | C | D    |
|------|---|------|
| Id   |   | Id   |
| 358  |   | 8790 |
| 358  |   | 8807 |
| 358  |   | 8824 |
| 8922 |   | 2311 |
| 8850 |   | 8322 |
| 8456 |   | 7373 |
| 8435 |   | 8411 |
| 8389 |   | 7297 |
| 8368 |   | 8344 |
| 4226 |   | 402  |
| 3908 |   | 3854 |
| ...  |   | ...  |

# COLLISION CHECK DATA PROCESSING METHOD AND APPARATUS, ELECTRONIC DEVICE, AND STORAGE MEDIUM

CROSS REFERENCE TO RELATED APPLICATIONS

The disclosure is a U.S. National Stage Application of International Patent Application No. PCT/CN2018/092323, entitled "COLLISION CHECK DATA PROCESSING METHOD AND APPARATUS, ELECTRONIC DEVICE, AND STORAGE MEDIUM", filed on Jun. 22, 2018, which claims the benefit of priority to Chinese Patent Application No. CN201710675565.3, entitled "COLLISION CHECK DATA PROCESSING METHOD AND APPARATUS", filed on Aug. 9, 2017, which are all incorporated herein by reference in their entireties.

FIELD

The disclosure relates to the field of data processing technologies, and in particular, to a collision check data processing method and apparatus, an electronic device, and a storage medium.

BACKGROUND

With the rapid development of economy and the increasingly concentrated distribution of social population, the demand for super-high-rise buildings also increases. At the same time, as the steel structure construction technology becomes increasingly mature, the amount of steel used in the construction of high-rise buildings also keeps increasing, leading to the increasing workload of design deepening.

Tekla Structures software, as a building information modeling software, can realize accurate, detailed and easy-to-construct 3D model modeling and management in the case of very complex materials or structures. A Tekla model built with the Tekla Structures software is suitable for the whole construction process from conceptual design to manufacturing, erection, and construction management.

Currently, design deepening using the Tekla Structures software is a work with huge workload and information, and a project usually needs to be designed and completed jointly by many people. Since each project has similar members, designers often improve work efficiency with a "copy-modify" method. Additionally, all the work is completed manually, and various problems may inevitably occur in the designed Tekla model, such as parts collision, parts overlap, bolt leakage, bolt misalignment, and so on. In the prior art, when the designed Tekla model is checked, a collision check function of the Tekla Structures software is usually configured to check a part under collision. The collision check function of the Tekla Structures software only can check all the parts together currently, so when a large number of parts are involved in the Tekla model, the amount of generated collision check data is also large. The technical personnel needs to check the entire collision check data when needing to check the collision of a certain kind of parts, and thus the check is inefficient.

SUMMARY

A main objective of the disclosure is to provide a collision check data processing method and apparatus, an electronic device, and a storage medium, aiming at alleviate the technical problem in the prior art that a single item among the collision check data cannot be checked, thus leading to low work efficiency.

To achieve the above objective, in a first aspect of the disclosure, a method for processing collision check data is provided, the method including:

acquiring generated collision check data, and acquiring an Identification (ID) number of a collision part according to the collision check data;

acquiring ID numbers corresponding to selected designated parts from a preset database; and determining a target part under collision according to the ID numbers corresponding to the designated parts and the ID number of the collision part.

Optionally, the part includes steel members and bolts, and acquiring an ID number of a collision part according to the collision check data includes:

determining a collision part under collision based on the collision check data, the collision comprising collision between the steel members, collision between the steel member and the bolt, and collision between the bolts; and acquiring the ID number of the collision part.

Optionally, determining a target part under collision according to the ID numbers corresponding to the designated parts and the ID number of the collision part includes:

looking up the ID number of the collision part in the ID numbers corresponding to the designated parts; and determining the collision part as the target part under collision if the ID number of the collision part is in the ID numbers corresponding to the designated parts.

Optionally, looking up the ID number of the collision part in the ID numbers corresponding to the designated parts includes:

establishing a table, and importing the ID numbers corresponding to the designated parts and the ID number of the collision part into the table respectively; and calling a preset VLOOKUP function to look up the ID number of the collision part in the ID numbers corresponding to the designated parts.

Optionally, after determining a target part under collision, the method further includes:

converting an ID number corresponding to the target part under collision to a file recognizable to Tekla Structures software.

Optionally, acquiring generated collision check data includes: selecting a Tekla file needing collision check by the Tekla Structures software, performing collision check on the selected Tekla file, generating collision check data, and acquiring the generated collision check data.

Optionally, before performing collision check on the selected Tekla file, the method further includes:

adjusting collision settings of the parts, defining a space required by collision check of the parts, and filtering unrelated parts.

Optionally, the ID numbers in the preset database are obtained through the following step: storing ID numbers corresponding to various types of parts included in the Tekla file into the preset database after the Tekla file is edited by the Tekla Structures software.

Optionally, the ID numbers are unique codes corresponding to various parts, and the ID numbers corresponding to the various parts are different so as to distinguish the various parts.

Besides, to achieve the above objective, in a second aspect of the disclosure, an apparatus for processing collision check data is provided, the apparatus including:

a first acquisition module configured to acquire generated collision check data, and acquire an ID number of a collision part according to the collision check data;

a second acquisition module configured to acquire ID numbers corresponding to selected designated parts from a preset database; and a screening module configured to determine a target part under collision according to the ID numbers corresponding to the designated parts and the ID number of the collision part.

Optionally, the part includes steel members and bolts, and the first acquisition module is configured to:

determine a collision part under collision based on the collision check data, and acquire the ID number of the collision part, the collision including collision between the steel members, collision between the steel member and the bolt, and collision between the bolts.

Optionally, the screening module includes:

a lookup module configured to look up the ID number of the collision part in the ID numbers corresponding to the designated parts; and a determination module configured to determine the collision part as the target part under collision if the ID number of the collision part is in the ID numbers corresponding to the designated parts.

Optionally, the lookup module is configured to:

establish a table, and import the ID numbers corresponding to the designated parts and the ID number of the collision part into the table respectively; and call a preset VLOOKUP function to look up the ID number of the collision part in the ID numbers corresponding to the designated parts.

Optionally, the apparatus further includes:

a conversion module configured to convert an ID number corresponding to the target part under collision to a file recognizable to Tekla Structures software.

Optionally, the first acquisition module is configured to select a Tekla file needing collision check by the Tekla Structures software, perform collision check on the selected Tekla file, generate collision check data, and acquire the generated collision check data.

Optionally, the first acquisition module is configured to, before performing collision check on the selected Tekla file, adjust collision settings of the parts, define a space required by collision check of the parts, and filter unrelated parts.

Optionally, the ID numbers in the preset database are obtained through the following step: storing ID numbers corresponding to various types of parts included in the Tekla file into the preset database after the Tekla file is edited by the Tekla Structures software.

Optionally, the ID numbers are unique codes corresponding to various parts, and the ID numbers corresponding to the various parts are different so as to distinguish the various parts.

Besides, to achieve the above objective, in a third aspect of the disclosure, an electronic device is provided. The electronic device includes a processor and a memory stored with computer instructions that, when read and executed by the processor, cause the processor to perform the above method.

Besides, to achieve the above objective, in a fourth aspect of the disclosure, a storage medium is provided, which is stored with computer instructions that, when read and executed, cause to perform the above method.

According to the collision check data processing method and apparatus, the electronic device, and the storage medium provided in the disclosure, generated collision check data is acquired, and an ID number of a collision part is acquired according to the collision check data; then ID numbers corresponding to selected designated parts is acquired from a preset database; and a target part under collision is determined according to the ID numbers corresponding to the designated parts and the ID number of the collision part. Compared with the prior art, in the disclosure, a target part under collision can be determined among large amounts of collision check data according to an ID number corresponding to a designated part and an ID number of a collision part, so that with the solution in the disclosure, a single item among the collision check data can be checked according to a user requirement, thereby improving the check efficiency effectively.

To enable the above objectives, features, and advantages of the disclosure to be more comprehensible, detailed description is provided below according to preferred embodiments and with reference to the accompanying drawings.

BRIEF DESCRIPTION OF THE DRAWINGS

To illustrate the technical solutions in the disclosure or in the prior art more clearly, the accompanying drawings for describing the embodiments or the prior art are introduced briefly in the following. Apparently, the accompanying drawings in the following description are only some embodiments of the disclosure; those of ordinary skill in the art can obtain other drawings according to the accompanying drawings without creative efforts.

DETAILED DESCRIPTION OF THE EMBODIMENTS

To enable the inventive objectives, features, and advantages of the disclosure to be more obvious and comprehensible, the technical solutions in the disclosure will be described below clearly and completely with reference to the accompanying drawings in the disclosure. Apparently, the embodiments described are merely some rather than all of the embodiments of the disclosure. All other embodiments obtained by those skilled in the art without creative efforts are encompassed in the protection scope of the disclosure.

A collision check data processing method and apparatus, an electronic device, and a storage medium are provided in the following embodiments of the disclosure. The objective of checking a single item among the collision check data is achieved by, acquiring generated collision check data, and acquiring an ID number of a collision part according to the collision check data, then acquiring ID numbers corresponding to selected designated parts from a preset database, and determining a target part under collision according to the ID numbers corresponding to the designated parts and the ID number of the collision part.

Figure 1:
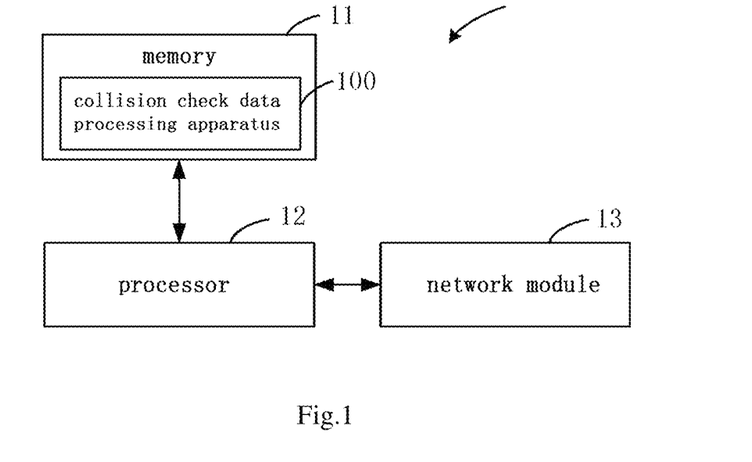
FIG. 1 is a schematic diagram of an application scenario according to the disclosure.

As shown in FIG. 1 which is a schematic block diagram of an electronic device 10 according to the disclosure. The electronic device 10 in the disclosure may be a terminal device, a server or the like with a data processing function. The electronic device 10 may implement the collision check data processing method in the disclosure. As shown in FIG. 1, the electronic device 10 includes: a memory 11, a processor 12, a network module 13, and a collision check data processing apparatus 100.

The memory 11, the processor 12, and the network module 13 are electrically connected directly or indirectly to each other for data transmission or exchange. For example, these elements may be electrically connected to each other through one or more communication buses or signal lines. The collision check data processing apparatus 100 is stored in the memory 11, and includes at least one software function module which may be stored in the form of software or firmware in the memory 11. The processor 12 performs various functional applications and data processing by running software programs and modules stored in the memory 11, for example, the collision check data processing apparatus 100 in the disclosure, that is, implements the collision check data processing method in the disclosure.

The memory 11 may be, but is not limited to, a Random Access Memory (RAM), a Read Only Memory (ROM), a Programmable Read-Only Memory (PROM), an Erasable Programmable Read-Only Memory (EPROM), an Electric Erasable Programmable Read-Only Memory (EEPROM), and so on. The memory 11 is configured to store programs, and the processor 12 executes the programs after receiving an execution instruction.

The processor 12 may be an integrated circuit chip having a data processing capability. The processor 12 may be a general-purpose processor, including a Central Processing Unit (CPU), a Network Processor (NP), and so on. The methods, steps, and logical block diagrams disclosed in the disclosure may be implemented or executed. The general-purpose processor may be a microprocessor or the processor may be any regular processor, etc.

The network module 13 is configured to establish a communication connection between the electronic device 10 and an external communication terminal through the network to send and receive network signals and data. The network signals may include wireless signals or wired signals.

It may be understood that the structure shown in FIG. 1 is only for the purpose of illustration, and the electronic device 10 may also include more or less components than those shown in FIG. 1, or have a configuration different from that shown in FIG. 1. The components shown in FIG. 1 may be implemented by using hardware, software, or a combination thereof.

Based on the above, a computer readable storage medium is further provided in the disclosure. The computer readable storage medium includes a computer program. When the computer program is run, the electronic device 10 where the computer readable storage medium is located is controlled to perform the following collision check data processing method.

Figure 2:
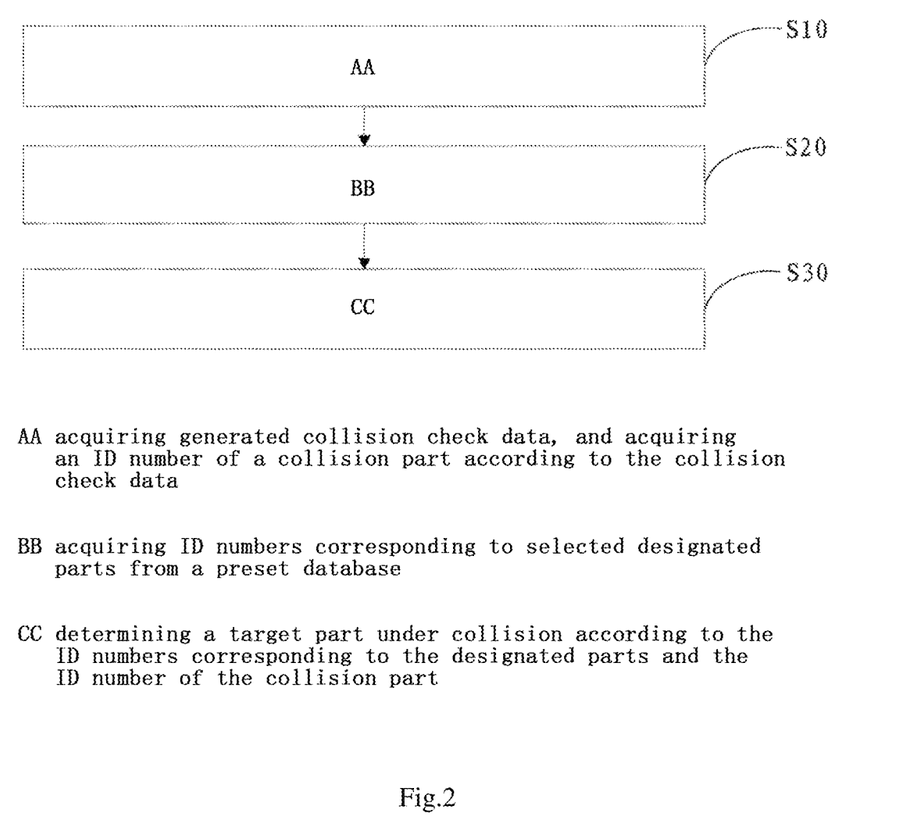
FIG. 2 is a schematic flowchart of a collision check data processing method according to the disclosure.

Referring to FIG. 2 which is a schematic flowchart of a collision check data processing method according to the disclosure. In this embodiment, the collision check data processing method includes the following steps. It should be understood that various steps of the collision check data processing method may be performed by the processor 12 in FIG. 1.

In step S10, generated collision check data is acquired, and an ID number of a collision part is acquired according to the collision check data.

In this embodiment, before the above step S10, an engineering technician first selects a Tekla file needing collision check through Tekla Structures software, then adjusts collision settings of parts, such as steel members and bolts, and defines a space required for collision check of the parts. Besides, some irrelevant parts may also be filtered to shorten the time spent in collision check, and then collision check may be performed on the selected Tekla file to generate collision check data. The irrelevant parts may be defined and set by the user or selected by the user, and correlation between the parts may be configured by the user through big data collection.

After collision check data is generated by the Tekla Structures software, the generated collision check data is acquired, and then an ID number of a collision part is acquired according to the collision check data.

The ID numbers are unique codes corresponding to various parts, and the ID numbers corresponding to the various parts are different so as to distinguish the various parts, for example, an ID number of a certain bolt is "1173."

In step S20, ID numbers corresponding to selected designated parts is selected from a preset database.

In this embodiment, all ID Numbers of parts of a certain type are acquired from a preset database when the collision of the parts of the type needs to be analyzed separately. For example, when the collision of a bolt of a certain type needs to be analyzed separately, all the ID Numbers of the bolt of the type are acquired from a preset database.

After the Tekla Structures software edits the Tekla file, ID numbers of each type of parts included in the Tekla file are stored in the above database.

In step S30, a target part under collision is determined according to the ID numbers corresponding to the designated parts and the ID number of the collision part.

In this embodiment, after the ID numbers corresponding to the designated parts and the ID number of the collision part are acquired, the ID number of the collision part is looked up in the ID numbers corresponding to the designated parts, and if an ID number of a certain collision part is in the ID numbers corresponding to the designated parts, the collision part corresponding to the ID number is determined as the target part under collision. If an ID number of a certain collision part is not in the ID numbers corresponding to the designated parts, the collision part corresponding to the ID number is determined as a non-target part under collision. For example, when the designated part is a certain type of bolt, if an ID number of a certain collision part is in the ID numbers corresponding to the designated parts, the collision part corresponding to the ID number is determined as a bolt under collision, thus screening the bolt under collision.

The collision check data processing method provided in this embodiment includes: acquiring generated collision check data, and acquiring an ID number of a collision part according to the collision check data; then acquiring ID numbers corresponding to selected designated parts from a preset database; and determining a target part under collision according to the ID numbers corresponding to the designated parts and the ID number of the collision part. Compared with the prior art, in this embodiment, a target part under collision can be determined among large amounts of collision check data according to an ID number corresponding to a designated part and an ID number of a collision part, so that a single item among the collision check data can be checked according to a user requirement, thereby improving the check efficiency effectively.

Figure 3:
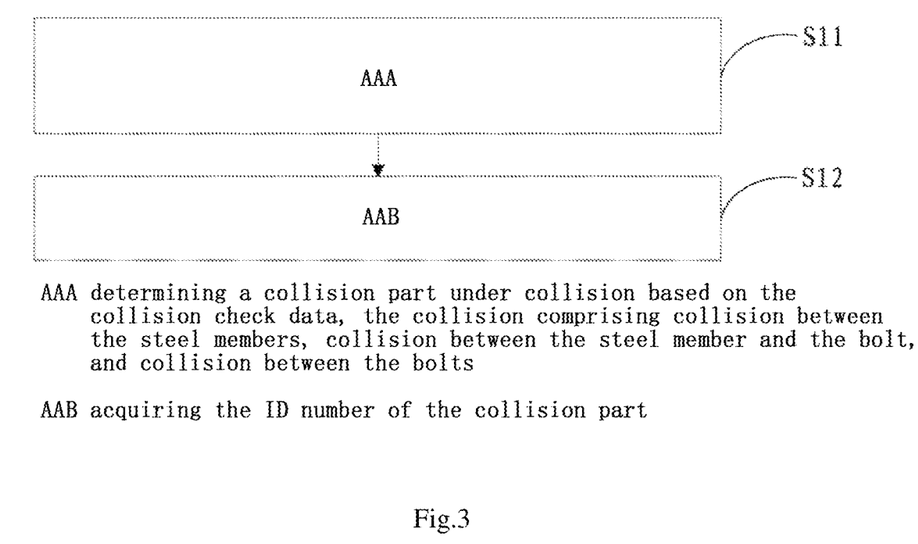
FIG. 3 is a schematic diagram of substeps of step S10 shown in FIG. 2 according to the disclosure.

On the basis of the above solution, referring to FIG. 3 which is a schematic diagram of substeps of step S10 shown in FIG. 2 according to the disclosure. In this embodiment, the part may include steel members and bolts, and the above step S10 includes the following steps.

In step S11, a collision part under collision is determined based on the collision check data, the collision including collision between the steel members, collision between the steel member and the bolt, and collision between the bolts.

In step S12, the ID number of the collision part is acquired.

In this embodiment, the part included in the Tekla file on which the collision check is performed includes steel members and bolts, and the collision of the part includes collision between the steel members, collision between the steel member and the bolt, and collision between the bolts.

Figure 4:
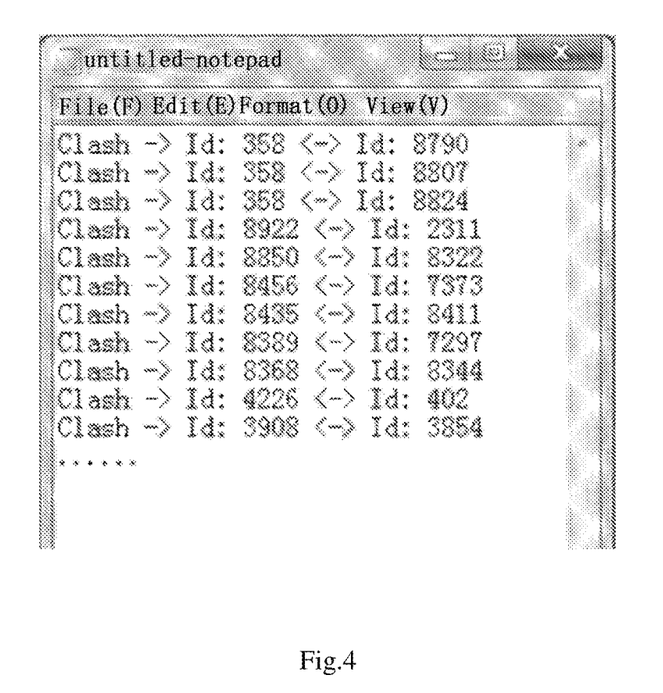
FIG. 4 is a schematic diagram of importing an ID number of a collision part into a designated document according to the disclosure.

After the collision part under collision is determined, the ID of the collision part is imported into a designated document (such as "a notepad") to identify which parts are under collision. To understand the disclosure better, please refer to FIG. 4, which is a schematic diagram of importing an ID number of a collision part into a designated document according to the disclosure. In FIG. 4, by taking the first row as an example, "Collision-> Id: 358 < -> Id: 8790" means that the part with an ID number 358 is under collision with the part with an ID number 8790.

After the ID number of the collision part is imported into the designated document, ID numbers of various collision parts are acquired, for subsequently determining a target part under collision.

According to this embodiment, a collision part under collision may be determined based on the collision check data, an ID number of the collision part is acquired, and then a target part under collision may be determined among large amounts of collision check data according to an ID number corresponding to a designated part that is acquired from a preset database and the ID number of the collision part.

Figure 5:
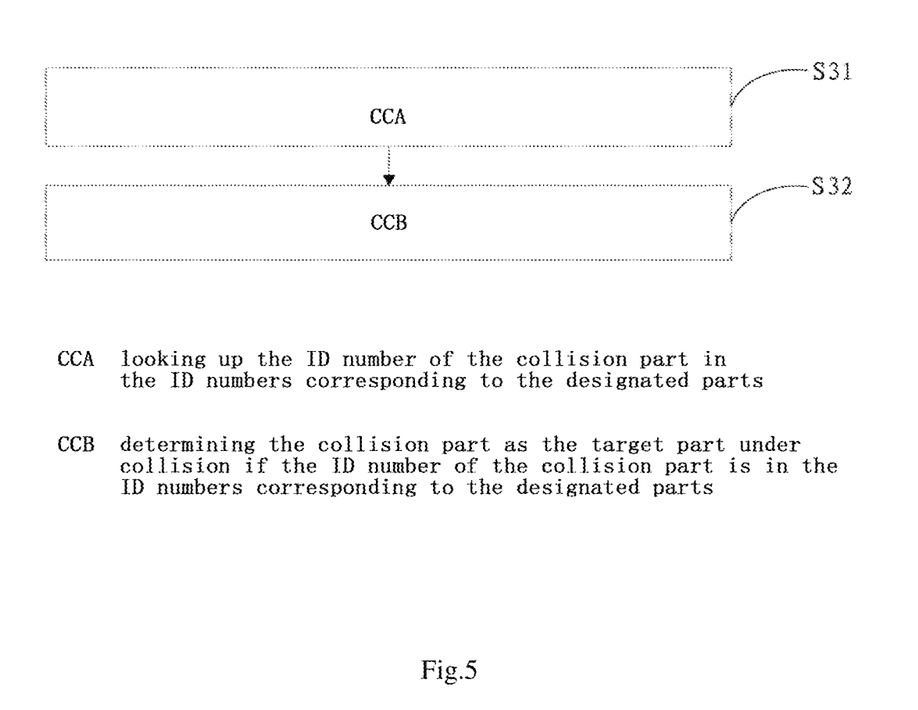
FIG. 5 is a schematic diagram of substeps of step S30 shown in FIG. 2 according to the disclosure.

Further, referring to FIG. 5, FIG. 5 is a schematic diagram of substeps of step S30 shown in FIG. 2 according to the disclosure. In this embodiment, the above step S30 includes the following steps.

In step S31, the ID number of the collision part is looked up in the ID numbers corresponding to the designated parts.

In step S32, the collision part is determined as the target part under collision if the ID number of the collision part is in the ID numbers corresponding to the designated parts.

The step S31 of looking up the ID number of the collision part in the ID numbers corresponding to the designated parts includes:

establishing a table, and importing the ID numbers corresponding to the designated parts and the ID number of the collision part into the table respectively; and calling a preset VLOOKUP function to look up the ID number of the collision part in the ID numbers corresponding to the designated parts.

Figure 6:
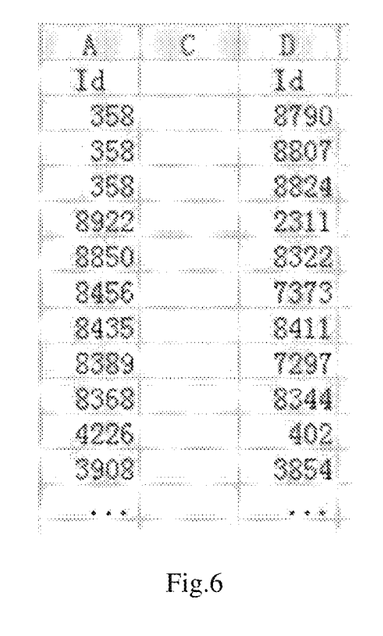
FIG. 6 is a schematic diagram after an ID number of a collision part is imported into a table according to the disclosure.

The table may be an Excel table. For example, the ID numbers of the collision parts are processed into two columns using separation and replacement functions and imported into the table. To understand the disclosure better, please refer to FIG. 6, which is a schematic diagram after an ID number of a collision part is imported into a table according to the disclosure.

Besides, the ID numbers corresponding to the designated parts are also processed into one column and imported into the table. At the same time, a column of figures "1" which has the same rows as the ID numbers of the above parts is added into the table. To understand the disclosure better, please refer to FIG. 7, which is a schematic diagram after ID numbers corresponding to designated parts are imported into a table according to the disclosure.

Figure 7:
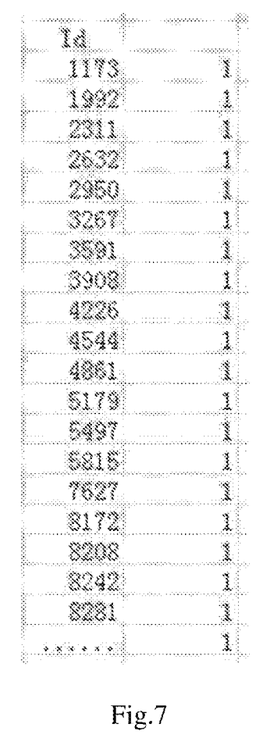
FIG. 7 is a schematic diagram after an ID number corresponding to a designated part is imported into a table according to the disclosure.

In this embodiment, after the ID numbers corresponding to the designated parts and the ID numbers of the collision parts are imported into the table respectively, a preset VLOOKUP function is called, and the ID numbers of the collision parts are looked up in the ID numbers corresponding to the designated parts. The VLOOKUP function is a vertical lookup function in the Excel table, which conducts lookup by column, and finally returns a value corresponding to a column order queried by the column. If no corresponding data is found, the VLOOKUP function will return an error value "#N/A."

Figure 8:
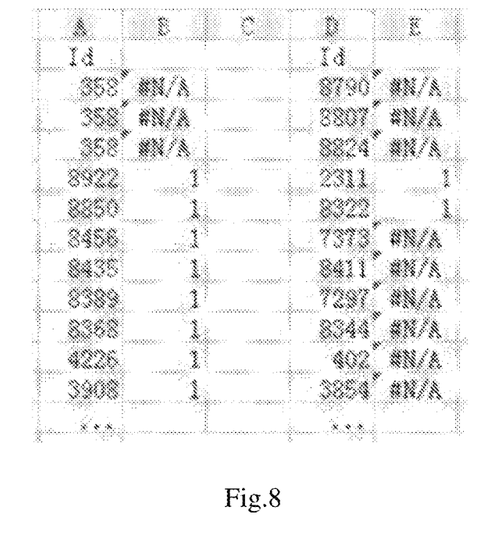
FIG. 8 is a schematic result diagram of calling a preset VLOOKUP function to look up the ID number of the collision part in the ID numbers corresponding to the designated parts according to the disclosure.

To understand the disclosure better, please refer to FIG. 8, which is a schematic result diagram of calling a preset VLOOKUP function to look up the ID numbers of the collision parts in the ID numbers corresponding to the designated parts according to the disclosure. In FIG. 8, by taking Column A and Column B as an example, when the value in Column B is "1," it means that the ID number of the collision part is in the ID numbers corresponding to the designated parts, that is, it is determined that the ID number in the same row in Column A is an ID number of a target part under collision. When the value in Column B is "#N/A," it means that the ID number of the collision part is not in the ID numbers corresponding to the designated parts, that is, it is determined that the ID number in the same row in Column A is an ID number of a non-target part under collision.

Further, after the target part under collision is determined, an ID number corresponding to the target part under collision is converted to a file recognizable to Tekla Structures software.

According to this embodiment, the ID number of the collision part is looked up in the ID numbers corresponding to the designated parts; and the collision part is determined as the target part under collision if the ID number of the collision part is in the ID numbers corresponding to the designated parts, so that the target part under collision may be determined in among large amounts of collision check data, achieving the purpose of checking a single item among the collision check data according to a user requirement, and improving the work efficiency effectively.

Figure 9:
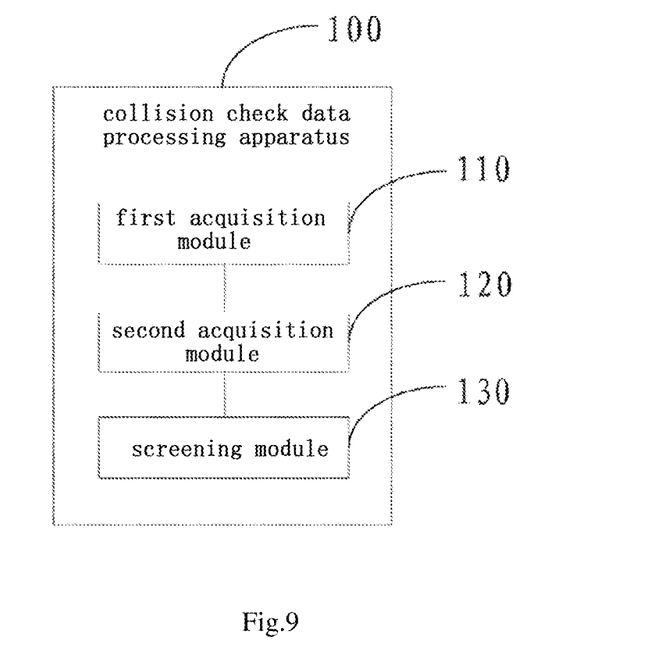
FIG. 9 is a schematic diagram of functional modules of a collision check data processing apparatus according to the disclosure.

Referring to FIG. 9, a collision check data processing apparatus 100 is further provided in the following embodiment of the disclosure, which is applied to the electronic device 10 in FIG. 1 and may be called by the processor 12, thus implementing the collision check data processing method in the disclosure. FIG. 9 is a schematic diagram of functional modules of a collision check data processing apparatus 100 according to the disclosure. In this embodiment, the collision check data processing apparatus 100 includes:

A first acquisition module 110 configured to acquire generated collision check data, and acquire an ID number of a collision part according to the collision check data.

In this embodiment, an engineering technician first selects a Tekla file needing collision check through Tekla Structures software, then adjusts collision settings of parts, such as steel members and bolts, and defines a space required for collision check of the parts. Besides, some irrelevant parts may also be filtered to shorten the time spent in collision check, and then collision check may be performed on the selected Tekla file to generate collision check data.

After collision check data is generated by the Tekla Structures software, the first acquisition module 110 acquires the generated collision check data, and then acquires an ID number of a collision part according to the collision check data.

The ID numbers are unique codes corresponding to various parts, and the ID numbers corresponding to the various parts are different so as to distinguish the various parts, for example, an ID number of a certain bolt is "1173."

A second acquisition module 120 configured to acquire ID numbers corresponding to selected designated parts from a preset database.

In this embodiment, the second acquisition module 120 acquires all ID Numbers of parts of a certain type from a preset database when the collision of the parts of the type needs to be analyzed separately. For example, when the collision of a bolt of a certain type needs to be analyzed separately, all the ID Numbers of the bolt of the type are acquired from a preset database.

After the Tekla Structures software edits the Tekla file, ID numbers of each type of parts included in the Tekla file are stored in the above database.

A screening module 130 configured to determine a target part under collision according to the ID numbers corresponding to the designated parts and the ID number of the collision part.

In this embodiment, after the ID numbers corresponding to the designated parts and the ID number of the collision part are acquired, the screening module 130 looks up the ID number of the collision part in the ID numbers corresponding to the designated parts, and if an ID number of a certain collision part is in the ID numbers corresponding to the designated parts, determines the collision part corresponding to the ID number as the target part under collision; and if an ID number of a certain collision part is not in the ID numbers corresponding to the designated parts, determines the collision part corresponding to the ID number as a non-target part under collision. For example, when the designated part is a certain type of bolt, if an ID number of a certain collision part is in the ID numbers corresponding to the designated parts, the collision part corresponding to the ID number is determined as a bolt under collision, thus screening the bolt under collision.

The collision check data processing apparatus 100 provided in this embodiment includes: a first acquisition module 110 configured to acquire generated collision check data, and acquire an ID number of a collision part according to the collision check data; a second acquisition module 120 configured to acquire ID numbers corresponding to selected designated parts from a preset database; and a screening module 130 configured to determine a target part under collision according to the ID numbers corresponding to the designated parts and the ID number of the collision part. Compared with the prior art, in this embodiment, a target part under collision may be determined among large amounts of collision check data according to an ID number corresponding to a designated part and an ID number of a collision part, so that a single item among the collision check data may be checked according to a user requirement, thereby improving the check efficiency effectively.

Further, in this embodiment, the part may include steel members and bolts, and the first acquisition module 110 is configured to:

determine a collision part under collision based on the collision check data, and acquire the ID number of the collision part, the collision including collision between the steel members, collision between the steel member and the bolt, and collision between the bolts.

In this embodiment, the part included in the Tekla file on which the collision check is performed includes steel members and bolts, and the collision of the part includes collision between the steel members, collision between the steel member and the bolt, and collision between the bolts.

After the collision part under collision is determined, the ID of the collision part is imported into a designated document (such as "a notepad") to identify which parts are under collision. To understand the disclosure better, please refer to FIG. 4, which is a schematic diagram of importing an ID number of a collision part into a designated document according to the disclosure. In FIG. 4, by taking the first row as an example, "Collision-> Id: 358 < -> Id: 8790" means that the part with an ID number 358 is under collision with the part with an ID number 8790.

After the ID number of the collision part is imported into the designated document, the first acquisition module 110 acquires ID numbers of various collision parts, for subsequently determining a target part under collision.

The first acquisition module 110 in this embodiment may determine a collision part under collision based on the collision check data and acquire an ID number of the collision part, and then may determine a target part under collision among large amounts of collision check data according to an ID number corresponding to a designated part that is acquired from a preset database and the ID number of the collision part.

Figure 10:
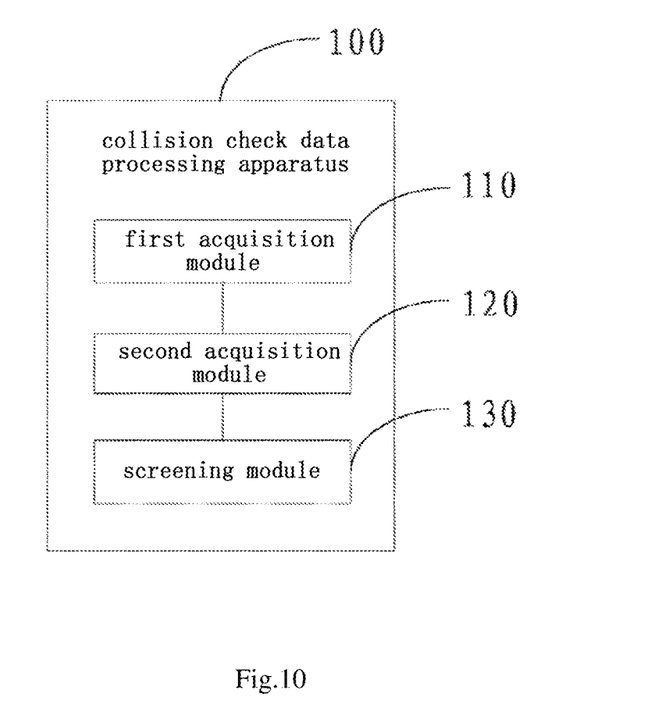
FIG. 10 is a schematic diagram of functional sub-modules of the screening module 130 shown in FIG. 9 according to the disclosure.

Further, referring to FIG. 10, FIG. 10 is a schematic diagram of functional sub-modules of the screening module 130 shown in FIG. 9 according to the disclosure. In this embodiment, the screening module 130 includes:

a lookup module 131 configured to look up the ID number of the collision part in the ID numbers corresponding to the designated parts; and a determination module 132 configured to determine the collision part as the target part under collision if the ID number of the collision part is in the ID numbers corresponding to the designated parts.

The lookup module 131 is configured to:

establish a table, and import the ID numbers corresponding to the designated parts and the ID number of the collision part into the table respectively; and call a preset VLOOKUP function to look up the ID number of the collision part in the ID numbers corresponding to the designated parts.

The table may be an Excel table. For example, the ID numbers of the collision parts are processed into two columns using separation and replacement functions and imported into the table. To understand the disclosure better, please refer to FIG. 6, which is a schematic diagram after an ID number of a collision part is imported into a table according to the disclosure.

Besides, the ID numbers corresponding to the designated parts are also processed into one column and imported into the table. At the same time, a column of figures "1" which has the same rows as the ID numbers of the above parts is added into the table. To understand the disclosure better, please refer to FIG. 7, which is a schematic diagram after ID numbers corresponding to designated parts are imported into a table according to the disclosure.

In this embodiment, after the ID numbers corresponding to the designated parts and the ID numbers of the collision parts are imported into the table respectively, the lookup module 131 calls a preset VLOOKUP function, and looks up the ID numbers of the collision parts in the ID numbers corresponding to the designated parts. The VLOOKUP function is a vertical lookup function in the Excel table, which conducts lookup by column, and finally returns a value corresponding to a column order queried by the column. If no corresponding data is found, the VLOOKUP function will return an error value "#N/A."

To understand the disclosure better, please refer to FIG. 8, which is a schematic result diagram of calling a preset VLOOKUP function to look up the ID numbers of the collision parts in the ID numbers corresponding to the designated parts according to the disclosure. In FIG. 8, by taking Column A and Column B as an example, when the value in Column B is "1," it means that the ID number of the collision part is in the ID numbers corresponding to the designated parts, that is, it is determined that the ID number in the same row in Column A is an ID number of a target part under collision. When the value in Column B is "#N/A," it means that the ID number of the collision part is not in the ID numbers corresponding to the designated parts, that is, it is determined that the ID number in the same row in Column A is an ID number of a non-target part under collision.

Further, the apparatus further includes a conversion module configured to convert an ID number corresponding to the target part under collision to a file recognizable to Tekla Structures software.

According to this embodiment, the lookup module 131 looks up the ID number of the collision part in the ID numbers corresponding to the designated parts, and determines the collision part as the target part under collision if the ID number of the collision part is in the ID numbers corresponding to the designated parts, so that the target part under collision may be determined in among large amounts of collision check data, achieving the purpose of checking a single item among the collision check data according to a user requirement, and improving the work efficiency effectively.

In the embodiments provided in the disclosure, it should be understood that the disclosed apparatus and method may be implemented in other manners. For example, the apparatus embodiment described above is merely schematic. For example, the division of the modules is merely a logical function division, and there may be other division manners in an actual implementation. For example, multiple modules or components may be combined or integrated into another system, or some features may be ignored or not performed. In addition, the shown or discussed mutual couplings or direct couplings or communication connections may be implemented by using some interfaces. The indirect couplings or communication connections between apparatuses or modules may be implemented electrically, mechanically, or in other forms.

The modules described as separate parts may or may not be physically separate, and parts shown as modules may or may not be physical modules, may be located in one position, or may be distributed on a plurality of network modules. Some or all of the modules may be selected according to actual needs to achieve the objectives of the solutions of the embodiments.

In addition, functional modules in the embodiments of the present invention may be integrated into one processing module, or each of the modules may exist alone physically, or two or more modules are integrated into one module. The integrated module may be implemented in the form of hardware, or may be implemented in the form of a software functional module.

When the integrated module is implemented in the form of a software functional module and sold or used as an independent product, the integrated module may be stored in a computer-readable storage medium. Based on such understanding, the technical solutions of the disclosure essentially, or the part that makes contributions to the prior art, or all or a part of the technical solutions may be implemented in the form of a software product. The computer software product is stored in a storage medium, and includes several instructions for instructing a computer device (which may be a personal computer, a server, a network device or the like) to perform all or a part of the steps of the methods described in the embodiments of the disclosure. The storage medium includes: any medium that may store a program code, such as a USB flash drive, a removable hard disk, a Read-Only Memory (ROM), a Random Access Memory (RAM), a magnetic disk, or an optical disc.

It should be noted that for ease of description, the method embodiments are all described as a series of action combinations. However, those skilled in the art should understand that the disclosure is not limited to the described sequence of the actions, because some steps may be performed in another sequence or at the same time according to the disclosure. In addition, those skilled in the art should also understand that the embodiments described in this specification all belong to preferred embodiments, and the involved actions and modules are not necessarily mandatory to the disclosure.

In the above embodiments, the description of each embodiment has its own focus; for the content that is not detailed in a certain embodiment, reference may be made to the relevant description of another embodiment.

A collision check data processing method and apparatus, an electronic device, and a storage medium provided in the disclosure are described above. For those skilled in the art, there may be modifications to the specific implementations and application scopes according to the idea of the disclosure. Therefore, the content of the specification should not be construed as limiting the disclosure.

INDUSTRIAL APPLICABILITY

According to the collision check data processing method and apparatus, the electronic device, and the storage medium provided in the disclosure, a single item among the collision check data may be checked according to a user requirement, thereby improving the check efficiency effectively.

The invention claimed is:

1. A method for processing collision check data, comprising:
acquiring generated collision check data, and acquiring an ID number of a collision part according to the collision check data;
acquiring ID numbers corresponding to selected designated parts from a preset database; and determining a target part under collision according to the ID numbers corresponding to the designated parts and the ID number of the collision part;

wherein determining a target part under collision according to the ID numbers corresponding to the designated parts and the ID number of the collision part comprises:

looking up the ID number of the collision part in the ID numbers corresponding to the designated parts; and determining the collision part as the target part under collision if the ID number of the collision part is in the ID numbers corresponding to the designated parts;

wherein looking up the ID number of the collision part in the ID numbers corresponding to the designated parts comprises:

establishing a table, and importing the ID numbers corresponding to the designated parts and the ID number of the collision part into the table respectively; and calling a preset VLOOKUP function to look up the ID number of the collision part in the ID numbers corresponding to the designated parts.

2. The method according to claim 1, wherein the part comprises steel members and bolts, and acquiring an ID number of a collision part according to the collision check data comprises:

determining a collision part under collision based on the collision check data, the collision comprising collision between the steel members, collision between the steel member and the bolt, and collision between the bolts; and acquiring the ID number of the collision part.

3. The method according to claim 1, wherein after determining a target part under collision, the method further comprises:

converting an ID number corresponding to the target part under collision to a file recognizable to Tekla Structures software.

4. The method according to claim 1, wherein acquiring generated collision check data comprises: selecting a Tekla file needing collision check by the Tekla Structures software, performing collision check on the selected Tekla file, generating collision check data, and acquiring the generated collision check data.

5. The method according to claim 4, wherein before performing collision check on the selected Tekla file, the method further comprises:

adjusting collision settings of parts, defining a space required by collision check of the parts, and filtering unrelated parts.

6. The method according to claim 4, wherein the ID numbers in the preset database are obtained through the following step: storing ID numbers corresponding to various types of parts comprised in the Tekla file into the preset database after the Tekla file is edited by the Tekla Structures software.

7. The method according to claim 1, wherein the ID numbers are unique codes corresponding to various parts, and the ID numbers corresponding to the various parts are different so as to distinguish the various parts.

8. An apparatus for processing collision check data, comprising:

a first acquisition circuit configured to acquire generated collision check data, and acquire an ID number of a collision part according to the collision check data;

a second acquisition circuit configured to acquire ID numbers corresponding to selected designated parts from a preset database; and a screening circuit configured to determine a target part under collision according to the ID numbers corresponding to the designated parts and the ID number of the collision part;

wherein the screening circuit comprises:

a lookup circuit configured to lookup the ID number of the collision part in the ID numbers corresponding to the designated parts; and a determination circuit configured to determine the collision part as the target part under collision if the ID number of the collision part is in the ID numbers corresponding to the designated parts;

wherein the lookup circuit is configured to:

establish a table, and import the ID numbers corresponding to the designated parts and the ID number of the collision part into the table respectively; and call a preset VLOOKUP function to look up the ID number of the collision part in the ID numbers corresponding to the designated parts.

9. The apparatus according to claim 8, wherein the part comprises steel members and bolts, and the first acquisition circuit is configured to:

determine a collision part under collision based on the collision check data, and acquire the ID number of the collision part, the collision comprising collision between the steel members, collision between the steel member and the bolt, and collision between the bolts.

10. The apparatus according to claim 8, wherein the apparatus further comprises:

a conversion circuit configured to convert an ID number corresponding to the target part under collision to a file recognizable to Tekla Structures software.

11. The apparatus according to claim 8, wherein the first acquisition circuit is configured to select a Tekla file needing collision check by the Tekla Structures software, perform collision check on the selected Tekla file, generate collision check data, and acquire the generated collision check data.

12. The apparatus according to claim 11, wherein the first acquisition circuit is configured to, before performing collision check on the selected Tekla file, adjust collision settings of parts, define a space required by collision check of the parts, and filter unrelated parts.

13. The apparatus according to claim 11, wherein the ID numbers in the preset database are obtained through the following step: storing ID numbers corresponding to various types of parts comprised in the Tekla file into the preset database after the Tekla file is edited by the TeklaStructures software.

14. The apparatus according to claim 8, wherein the ID numbers are unique codes corresponding to various parts, and the ID numbers corresponding to the various parts are different so as to distinguish the various parts.

* * * * *